(12) United States Patent
Kondo et al.

(10) Patent No.: US 7,932,510 B2
(45) Date of Patent: Apr. 26, 2011

(54) CARBON NANOTUBE GROWN ON CATALYST AND MANUFACTURE METHOD

(75) Inventors: Daiyu Kondo, Kawasaki (JP); Shintaro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 316 days.

(21) Appl. No.: 12/210,751

(22) Filed: Sep. 15, 2008

(65) Prior Publication Data

US 2009/0065765 A1    Mar. 12, 2009

Related U.S. Application Data

(63) Continuation of application No. PCT/JP2006/305226, filed on Mar. 16, 2006.

(51) Int. Cl.
  *H01L 27/00* (2006.01)
  *H01L 29/02* (2006.01)
  *H01L 21/02* (2006.01)
(52) U.S. Cl. ......... 257/5; 257/E29.002; 257/E21.002; 257/E27.001; 438/478; 438/900; 977/742; 977/779; 977/762
(58) Field of Classification Search ....... 257/5, E29.002, 257/E27.001, E21.002; 438/478, 900; 977/742, 977/762, 779
See application file for complete search history.

(56) References Cited

U.S. PATENT DOCUMENTS

| | | | |
|---|---|---|---|
| 2002/0160111 A1* | 10/2002 | Sun et al. | 427/248.1 |
| 2005/0215049 A1 | 9/2005 | Horibe et al. | |
| 2006/0165585 A1* | 7/2006 | Eres | 423/445 B |
| 2009/0016951 A1* | 1/2009 | Kawabata et al. | 423/447.2 |
| 2009/0278556 A1* | 11/2009 | Man et al. | 324/693 |

FOREIGN PATENT DOCUMENTS

| | | |
|---|---|---|
| JP | 09-188509 A | 7/1997 |
| JP | 2005-22886 A | 1/2005 |
| JP | 2005-279624 A | 10/2005 |
| JP | 2005-285821 A | 10/2005 |

OTHER PUBLICATIONS

International Search Report of PCT/JP2006/305226, date of mailing Apr. 18, 2006.
Sato, Shintaro et al., "Carbon nanotube growth from titanium-cobalt bimetallic particles as a catalyst", Chemical Physics Letters, vol. 402, pp. 149-154.

* cited by examiner

*Primary Examiner* — Victor Mandala
(74) *Attorney, Agent, or Firm* — Westerman, Hattori, Daniels & Adrian, LLP

(57) ABSTRACT

A method for manufacturing carbon nanotubes includes the steps of: (a) depositing catalytic fine particles containing Al—Fe, Zr—Co or Hf—Co on a base body; and (b) growing carbon nanotubes on the catalytic fine particles deposited on the base body.

18 Claims, 9 Drawing Sheets

US 7,932,510 B2

CARBON NANOTUBE GROWN ON CATALYST AND MANUFACTURE METHOD

CROSS REFERENCE TO RELATED APPLICATION

This application is based on PCT/JP2006/305226 filed on Mar. 16, 2006, the entire contents of which are incorporated herein by reference.

BACKGROUND

A) Field

The present invention relates to carbon nanotube, and more particularly to a carbon nanotube containing structure, a method for manufacturing carbon nanotubes, an electric function device, and catalytic fine particles for growing carbon nanotubes.

B) Description of the Related Art

A carbon nanotube is a single-walled or multi-walled cylindrical tube, each wall or layer being graphite carbon atom plane having a thickness of several atom layers, rounded into a tube-shape. The carbon nanotube is a fine structure having an outer diameter of nm order. Carbon nanotubes are applied to various fields because of excellent characteristics such as high electric conductivity, high thermal conductivity and high mechanical strength. Although various studies have been made, the details of growth of carbon nanotubes are still not elucidated.

It is generally considered that metal catalyst functions as nuclei of growth of carbon nanotubes. In addition to pure metal catalyst such as cobalt (Co), iron (Fe) and nickel (Ni), binary metal catalysts such as Co—Mo, Fe—Mo, Fe—Co and Fe—Ni are used in growing carbon nanotubes, particularly single-walled carbon nanotubes (SWNT). Co—Mo and Fe—Mo are combinations of a metal of strong catalytic function, Co and Fe, and Mo having a weak catalytic function. Fe—Co and Fe—Ni are combinations of metals, each having strong catalytic function such as Fe, Co and Ni.

Known growth methods are arc discharge method, laser ablation method, chemical vapor deposition (CVD) method and the like. With the carbon nanotube growing method by CVD, catalytic metal is vapor deposited on a substrate by sputtering or the like and restructured in the form of fine particles by heating, and carbon nanotubes are grown by using catalytic fine particles as nuclei.

JP-A-HEI-9-188509 indicates that secular instability is inevitable in the growth of carbon nanotubes by arc discharge using a carbon rod, and proposes a method for manufacturing carbon nanotubes by which electrodeless discharge plasma is generated, gas having good supply amount controllability such as hydrogen carbide, e.g., methane, is used as carbon source material, and metal catalyst such as iron, nickel and cobalt is supplied separately. The peripheral region of plasm and a substrate for collecting carbon nanotubes are cooled. The metal catalyst is vaporized in plasma, and hydrogen carbide is dissolved. Fine particles are formed in a low temperature area of the plasma peripheral region, and carbon atoms form carbon nanotubes on fine particles by the catalytic function.

JP-A-2005-22886 proposes a carbon nanotube growth method by which on an Si substrate having a via hole etched by using a resist pattern, catalytic fine particles are formed by ablating a target such as Ni, Fe and Co with Nd:YAG laser, annealed and given electric charges, classified by a differential mobility analyzer (DMA) or the like to select catalytic fine particles having a uniform diameter, the catalytic fine particles are blown and deposited on the bottom of the via hole, and the particles on the upper surface are removed together with the resist pattern, to leave carbon nanotubes grown on the catalytic particles deposited in the via hole bottom.

JP-A-2005-285821 proposes a method of forming an underlying layer made of metal of Mo, V, Nb, W or Ti or its metal oxide on a substrate, forming a catalytic layer on the underlying layer, and growing carbon nanotubes on the catalytic layer.

A group of the present inventors has found that growth of multi-walled carbon nanotubes can be promoted greatly by forming a catalytic Co layer on a titanium (Ti) layer.

It has recently been clarified that a Ti layer or an aluminum (Al) layer formed as an underlying layer of catalyst supports the catalytic function and is effective for growth of carbon nanotubes. However, forming the underlying layer such as a Ti layer and an Al layer in a semiconductor device such as an LSI becomes an obstacle in some cases.

The present inventors and colleagues have reported in Chemical Physics Letters, 402 (2005) 149-154 the following thesis. "A Ti—Co alloy target was ablated with Nd:YAG laser and annealed at 1000° C. in a tubular type furnace and in an He atmosphere to form catalytic particles which were classified by a differential mobility analyzer (DMA) to select Ti—Co catalytic fine particles having a uniform diameter. The catalytic fine particles were blown and deposited on a (100) Si substrate, the substrate was heated to a growth temperature (610° C.) in a cooled wall type CVD system, and mixture gas of acetylene and argon (volume ratio: 1:9) was supplied. Carbon nanotubes having the same size as that of the catalytic particles were able to be grown on the catalytic particles." Diameters of the catalytic fine particles and carbon nanotubes were 5.8 nm (geometric standard deviation: 1.09) and 5.7 nm (geometric standard deviation: 1.13), respectively. The Ti:Co composition was 50:50. It has been found that a carbon nanotube diameter can be controlled by selecting a catalytic particle diameter.

A growth method for carbon nanotubes has not been established clearly yet.

SUMMARY

According to one aspect of the present invention, there is provided a carbon nanotube containing structure comprising a base body, catalytic fine particles deposited on the base body, the catalytic fine particles containing Al—Fe, Zr—Co or Hf—Co, and carbon nanotubes grown on the catalytic fine particles.

According to another aspect of the present invention, there is provided a method for manufacturing carbon nanotubes comprising (a) depositing catalytic fine particles containing Al—Fe, Zr—Co or Hf—Co on a base body; and (b) growing carbon nanotubes on the base body deposited with the catalytic fine particles.

DESCRIPTION OF THE PREFERRED EMBODIMENTS

Embodiments of the present invention will be described with reference to the accompanying drawings.

Figure 1A:
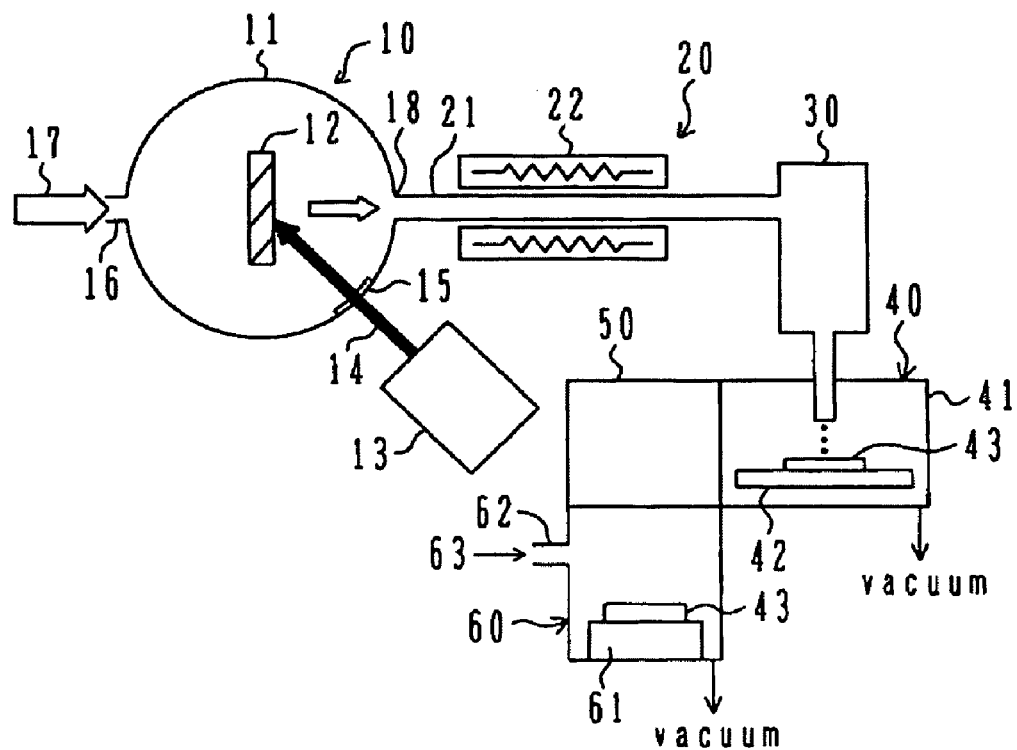
FIGS. 1A and 1B are a schematic cross sectional view of a carbon nanotube forming system and an enlarged cross sectional view of a differential mobility analyzer.

FIG. 1A shows a carbon nanotube forming system to be used for the embodiments. A catalytic fine particle manufacture apparatus 10 is an apparatus for forming catalytic fine particles by laser ablation of a target 12. A reaction chamber 11 has a gas inlet port 16 for introducing carrier gas 17 and a gas outlet port 18 for expelling the carrier gas. An Al—Fe target 12 is accommodated in the reaction chamber 11. Twofold waves (secondary harmonics) 14 of a pulse laser beam from an Nd:YAG laser 13 are radiated to the target 12 via a window 15.

It is assumed that the carrier gas is He gas at a pressure of about 10 torr and a flow rate of 1 slm (standard liter per minute), the target is an Al—Fe (atomic fraction: 50:50) alloy target and a pulse repetition frequency of secondary harmonics of the Nd:YAG laser beam is 20 Hz. Al—Fe vapor is generated from the Al—Fe target 12 radiated with Nd:YAG secondary harmonics and cooled with the carrier gas to generate Al—Fe fine particles. The carrier gas which loads Al—Fe fine particles is sent to a pipe 21 via the gas outlet port 18.

An electric heater 22 is mounted around the pipe 21, constituting a tubular electric furnace 20. The tubular electric furnace 20 anneals Al—Fe fine particles at about 1000° C., and supplies the particles together with the carrier gas to a differential mobility analyzer (DMA) 30.

Figure 1B:
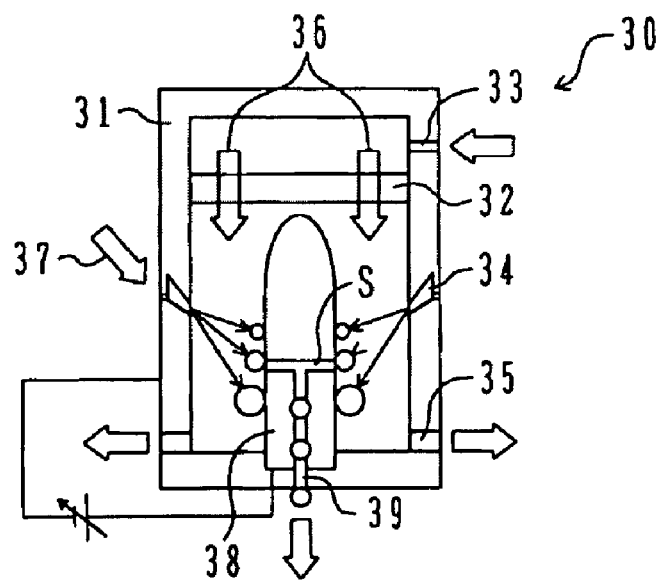

FIG. 1B is a schematic diagram showing the structure of DMA 30. A process chamber 31 is partitioned into upper and lower rooms by a filter 32. The upper room is provided with a sheath gas inlet port 33, and the lower room is provided with an inlet port 34 for the Al—Fe fine particles carried in the carrier gas and an output port 35 for excess gas. A classifier 38 is coupled to the bottom of DMA 30. The classifier 38 has a slit S formed in the side wall and an output nozzle 39 having an inner diameter of 4 mm at the bottom wall. Gas entered the slit S is jetted out from the output nozzle 39.

DC voltage is applied across the classifier 38 and process chamber 31. Electric charges are given to fine particles in the carrier gas jetted out from the carrier gas inlet port 34. Sheath gas 36 jetted out downward makes the carrier gas 37 flow downward. Fine particles receive forces in the downward direction by the electric field. Since resistance force by the gas depends on the size of fine particles, the fine particles move toward the classifier 38 at a speed dependent upon the size. The slit S receives fine particles having a predetermined diameter, and the output nozzle 39 of the classifier jets out the fine particles of classified diameter downward. In this embodiment, classified fine particles of uniform diameter, 5 nm±10% (geometrical standard deviation of 1.10), are supplied from the nozzle 39. By using this system, it becomes possible to change the atomic fraction of fine particles by changing the atomic fraction of the alloy target.

A deposition chamber 40 shown in FIG. 1A has a movable stage 42 in a room 41, and a substrate 43 is placed on the movable stage 42. Fine particles jetted out from the output nozzle 39 of DMA 30 attach the substrate 43 and are deposited thereon. A silicon substrate was used as the substrate 43. By scanning the stage 42, fine particles can be deposited uniformly in a desired area.

Figure 2C:
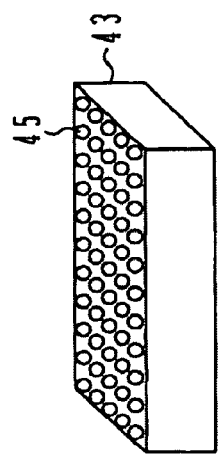
FIGS. 2C and 2D are sketches of FIGS. 2A and 2B.
Figure 2D:
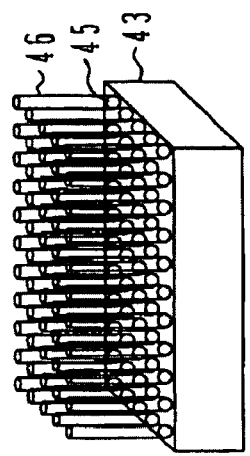
Figure 2A:
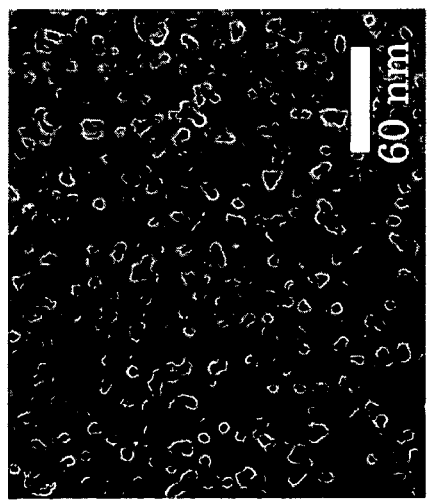
FIGS. 2A and 2B show a scanning electron microscope (SEM) image of Al—Fe (atomic fraction: 50:50 (at %)) fine particles having a diameter of 5 nm deposited on a silicon substrate, and a SEM image of carbon nanotubes above the silicon substrate grown on the Al—Fe fine particles in 20 minutes.

FIG. 2A is a scanning electron microscope (SEM) image of Al—Fe fine particles deposited on a silicon substrate. It can be seen that Al—Fe fine particles having a uniform diameter of about 5 nm are deposited on the substrate by about one layer. A schematic sketch of this image is shown in FIG. 2C. Al—Fe fine particles 45 are distributed uniformly on the substrate 43.

The substrate 43 with deposited catalytic fine particles is transferred to a CVD chamber 60 via a transfer chamber 50, or after the substrate is once picked up in the atmospheric air if the transfer chamber does not exist. In the CVD chamber 60, the substrate 43 is placed on a susceptor 61 having a built-in heater, and heated to a growth temperature of 620° C. A hot filament disposed at a position about 1 cm just above the substrate 43 is heated to about 1000° C. not only to heat the substrate 43 but also to dissociate source gas 63 and supplement a supply of carbon to the fine particles. Mixture gas of acetylene and argon (volume ratio: 1:9) is supplied as the source gas 63 from a gas inlet port 62 at a flow rage of 200 sccm (standard cubic centimeter per minute) to grow carbon nanotubes by CVD at a pressure of 1 kPa. Prior to introducing mixture gas, a heating process was executed for 10 minutes in a hydrogen atmosphere (at a pressure of 1 kPa).

Figure 2B:
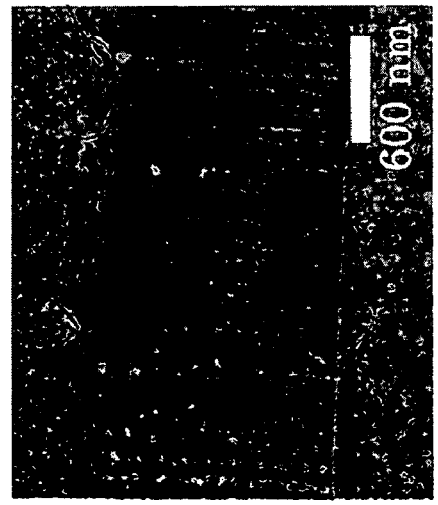

FIG. 2B shows a SEM image of carbon nanotubes on a silicon substrate after growth for 20 minutes. It can be seen that carbon nanotubes grow densely and at a uniform length of about 20 μm in a direction vertical to the surface of the substrate. Formed nanotubes were multi-walled carbon nanotubes having a diameter approximately the same as that of fine particles. As shown in the schematic sketch of FIG. 2D, carbon nanotubes 46 having a uniform diameter were grown vertical to the substrate, from Al—Fe fine particles deposited on the substrate 43. It can be understood that carbon nanotubes can be grown efficiently on catalytic Al—Fe fine particles. Grown carbon nanotubes can be used as wirings of LSI, bumps for heat dissipation and the like.

In order to study the validity of Al—Fe fine particles, carbon nanotubes are grown on a sample depositing Al—Fe fine particles on an Mo film formed as an underlying layer on a substrate and a sample depositing Fe fine particles on the Mo film. A diameter of fine particles of both samples is about 5 nm.

Figure 3A:
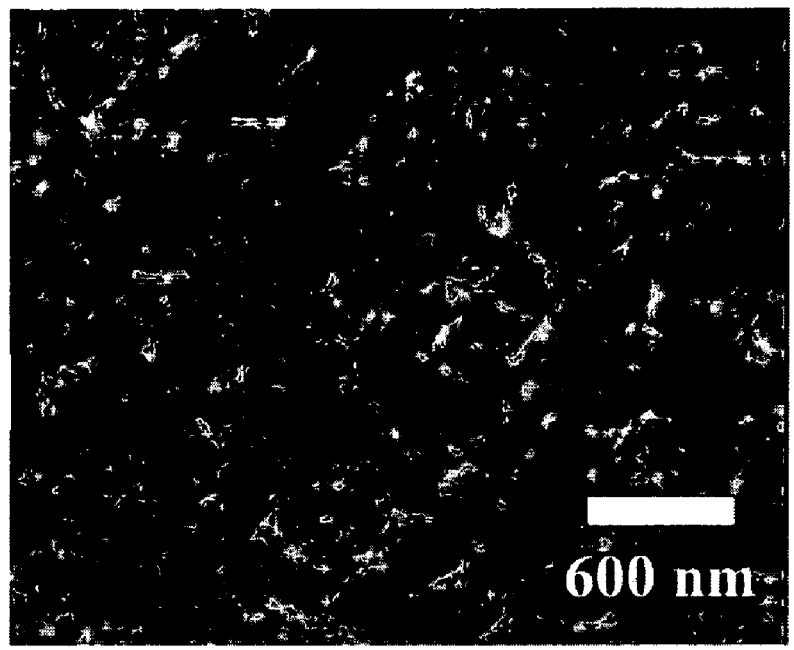
FIGS. 3A and 3B show a SEM image of a sample depositing Al—Fe fine particles on an Mo film and underwent CVD growth and a SEM image of a sample depositing Fe fine particles on an Mo film and underwent CVD growth.

FIG. 3A shows a SEM image of the sample depositing Al—Fe fine particles on the Mo film and underwent CVD growth. It can be seen that carbon nanotubes are densely grown on the substrate.

Figure 3B:
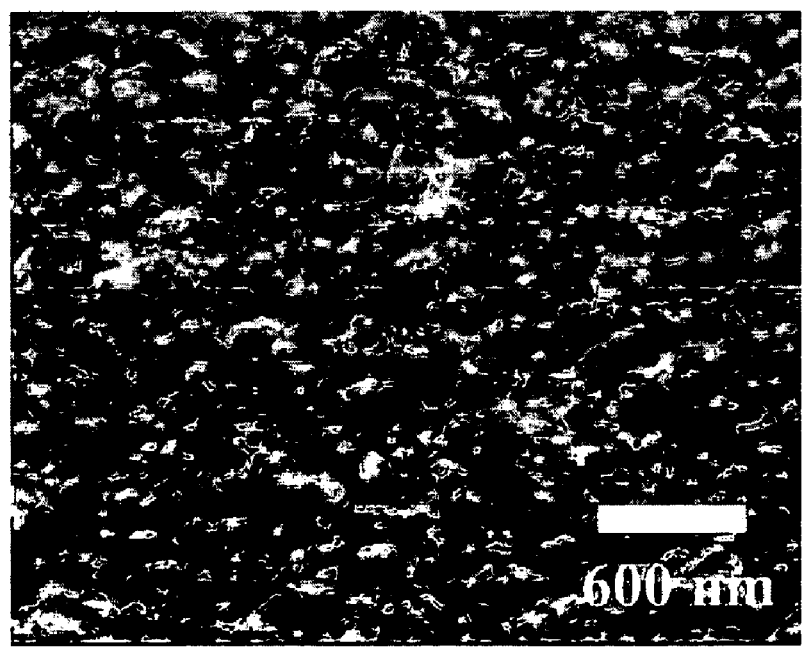

FIG. 3B shows a SEM image of the sample depositing Fe fine particles on the Mo film and underwent CVD growth. Growth of carbon nanotubes is not recognized. It can be considered that Al—Fe fine particles allow carbon nanotubes to be grown even under the substrate condition that carbon nanotubes cannot be grown from Fe fine particles which are well-known catalyst.

In the embodiment described above, the atomic fraction of Al—Fe is 50:50 (at %). The atomic fraction is not limited to 50:50. A fine particle forming method is not limited to a laser ablation method, but the fine particle forming method may be a sputtering method, a vapor deposition method using arc plasma, or a vapor deposition method heating and vapor depositing a target, respectively capable of forming fine particles. The CVD growth method is not limited to the method using a hot filament, but a thermal CVD method or a plasma CVD method may also be used. Source gas to be used may be hydrogen carbide or alcohol instead of acetylene. If catalytic fine particles having a desired diameter are not required to be formed, fine particles may be directly deposited on a desired substrate, without involvement of DMA. Classifying sizes is not limited to DMA, but a classifying method utilizing inertia of fine particles or other methods may be used.

Figure 4:
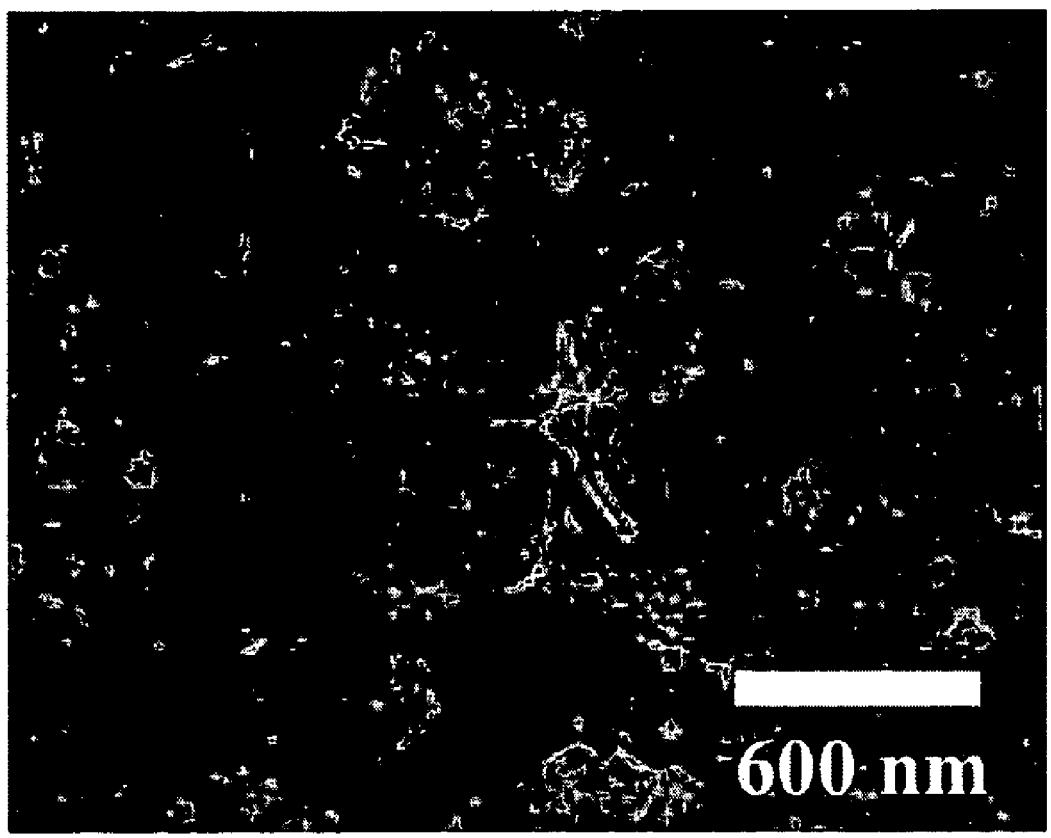
FIG. 4 shows a SEM image of carbon nanotubes grown on Al—Fe (atomic fraction: 20:80) fine particles having a diameter of 5 nm.

FIG. 4 shows a SEM image of a sample similar to the above-described embodiment, excepting that carbon nanotubes are grown on Al—Fe fine particles having a diameter of 5 nm and an Al—Fe atomic fraction of 80:20 (at %). CVD growth was performed at a growth temperature of 620° C. and a pressure of 1 kPa by supplying mixture gas of acetylene and argon (volume ratio: 1:9) as source gas (flow rate of 200 sccm). Prior to introducing the mixture gas, a heating process was performed for 10 minutes in a hydrogen atmosphere (pressure of 1 kPa). Even if an Al atomic fraction is increased, growth was confirmed although it becomes difficult to grow carbon nanotubes. It is expected that carbon nanotubes are grown effectively at an Al atomic fraction of 0.1% to 99%.

Since Fe functions mainly as catalyst of carbon nanotubes, a diameter of carbon nanotubes can be controlled by controlling not only a fine particle diameter but also an atomic fraction.

The carbon nanotubes grown by using, as catalytic fine particles, Al—Fe fine particles having a diameter of 5 nm and an Al—Fe atomic fraction of 50:50 (at %), were multi-walled carbon nanotubes having two or more layers (or walls). Next, growth of single-walled carbon nanotubes was tried. A catalytic fine particle diameter was set shorter to 2.5 nm.

Figure 5A:
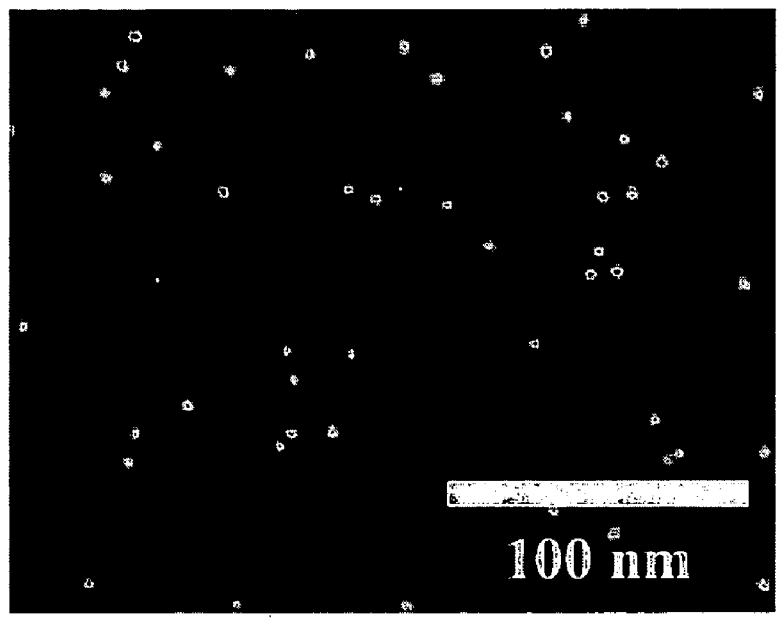
FIGS. 5A and 5B show a SEM image showing the state of Al—Fe fine particles having a diameter of 2.5 nm deposited on a silicon substrate and a SEM image of carbon nanotubes grown on the Al—Fe fine particles.

FIG. 5A shows a SEM image showing the state that Al—Fe fine particles having a diameter of 2.5 nm are deposited on a silicon substrate. A deposition density is set low. CVD growth was performed under the conditions that a total pressure in a CVD chamber was set to 100 Pa, a growth temperature was set to 590° C., and mixture gas of acetylene and argon (volume ratio: 1:9) diluted with hydrogen was supplied as source gas, at a mixture gas flow rate of 2 sccm and a hydrogen flow rate of 1998 sccm.

Figure 5B:
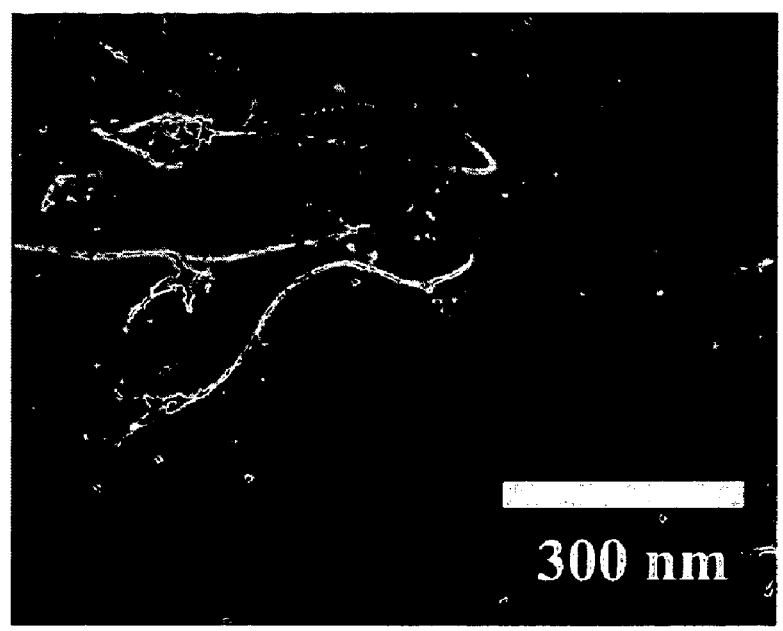

FIG. 5B shows a SEM image of carbon nanotubes grown on Al—Fe fine particles having a diameter of 2.5 nm. It can be seen that bundles of single-walled carbon nanotubes are grown along the surface of a substrate. Single-walled carbon nanotubes can be applied to a transistor channel or the like. By changing the diameter of Al—Fe fine particles, carbon nanotubes having a desired number of walls (or layers) can be grown.

Source material of compound fine particles of binary metal is not limited to Al—Fe. Effective growth of carbon nanotubes can be expected to be grown on catalytic fine particles of zirconium (Zr)-cobalt (Co), and hafnium (Hf)-cobalt (Co).

Figure 6A:
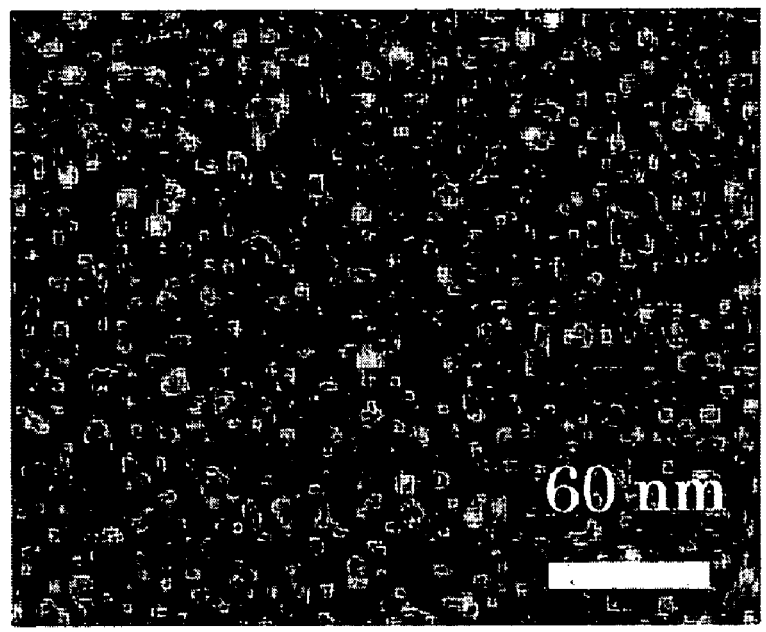
FIGS. 6A and 6B show a SEM image of zirconium (Zr)-cobalt (Co) (atomic fraction: 10:90 (at %)) having a diameter of 5 nm deposited on a silicon substrate and a SEM image of carbon nanotubes grown on the Zr—Co fine particles.

FIG. 6A shows a SEM image of a sample depositing Zr—Co fine particles having a diameter of about 5 nm uniformly on a silicon substrate. An atomic fraction of Zr—Co fine particles is 10:90 (at %), and fine particles of about one layer are deposited on the substrate.

CVD growth was performed at a growth temperature of 620° C. and a pressure of 1 kPa by supplying mixture gas of acetylene and argon (volume ratio: 1:9) as source gas (flow rate of 200 sccm).

Figure 6B:
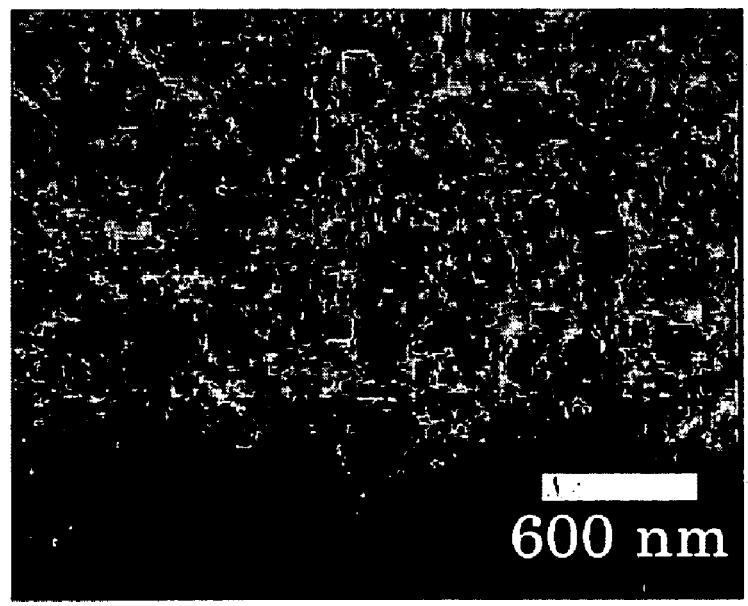

FIG. 6B shows a SEM image of a sample growing carbon nanotubes on Zr—Co fine particles deposited on a silicon substrate. It can be recognized clearly that multi-walled carbon nanotubes are grown densely over the substrate. When pure cobalt fine particles not containing zirconium were used, carbon nanotubes will not be grown. It can be considered that superiority of Zr—Co fine particles is demonstrated over Co fine particles well known as catalyst.

Figure 9:
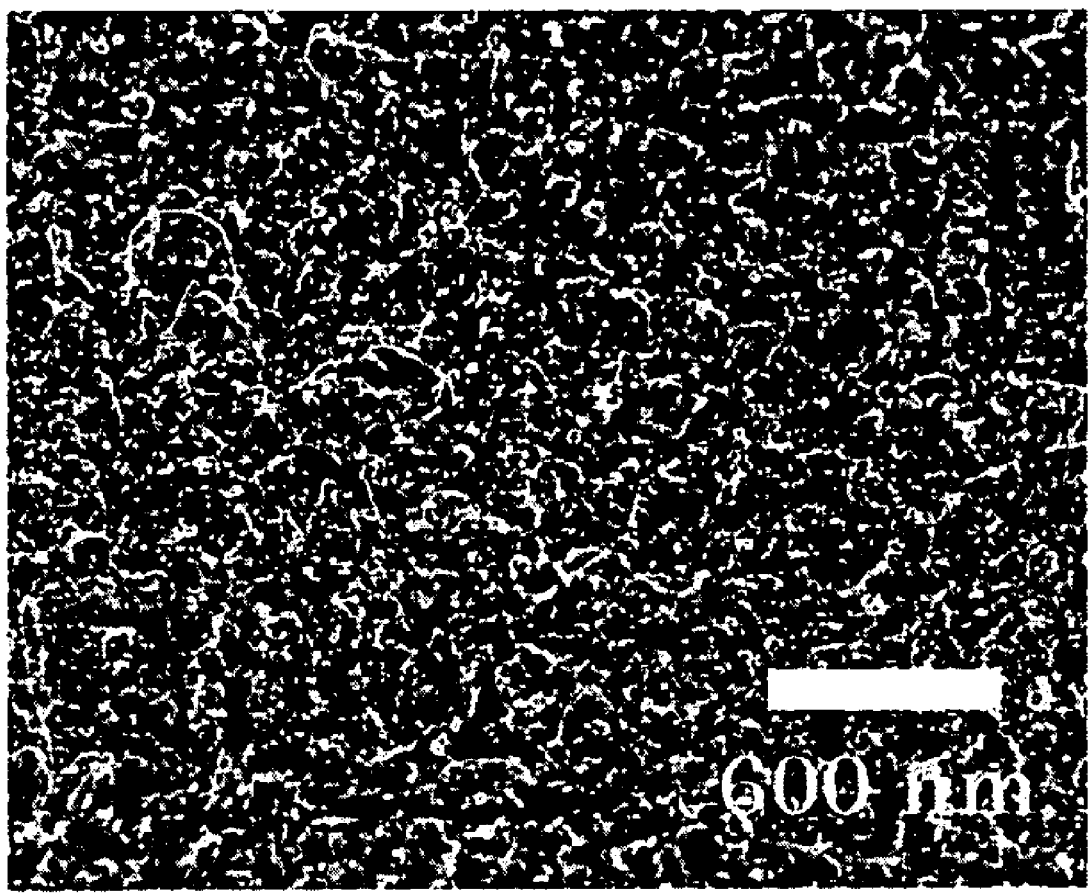
FIG. 9 shows a SEM image of carbon nanotubes grown, above the whole surface of a silicon substrate, on hafnium (Hf)-cobalt (Co) fine particles (atomic fraction: 10:90 (at %)) having a diameter of about 4.5 nm deposited uniformly on the silicon substrate.

FIG. 9 shows a SEM image of carbon nanotubes grown, above the whole surface of a silicon substrate, on hafnium (Hf)-cobalt (Co) fine particles (atomic fraction: 10:90 (at %)) having a diameter of about 4.5 nm and deposited uniformly on the silicon substrate. CVD growth was performed under the conditions that a growth temperature was set to 590° C., and mixture gas of acetylene and argon (volume ratio: 1:9) diluted with argon was supplied at a mixture gas flow rate of 2.5 sccm and an argon flow rate of 1000 sccm.

Under the CVD growth conditions used for FIG. 9, only carbon nanotubes short in length are grown on Hf—Co fine particles at a very low density. This indicates that although Co having a strong catalytic function is contained, the growth conditions become different depending upon a combination of metals.

Figure 7A:
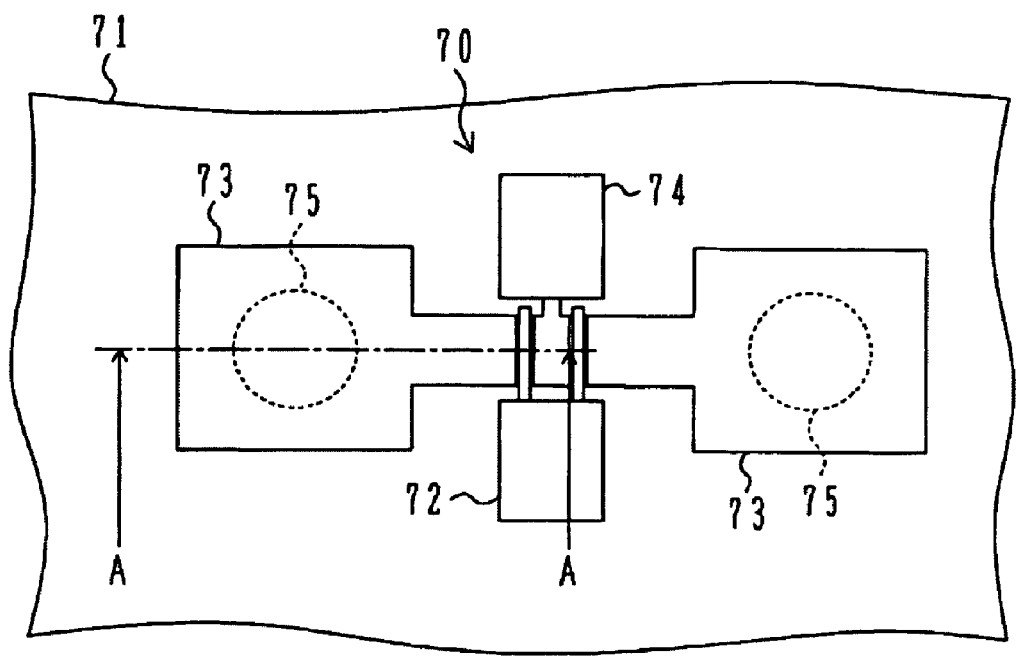
FIGS. 7A and 7B are a plan view of a semiconductor device of an embodiment and a cross sectional view taken along line A-A in FIG. 7A.
Figure 7B:
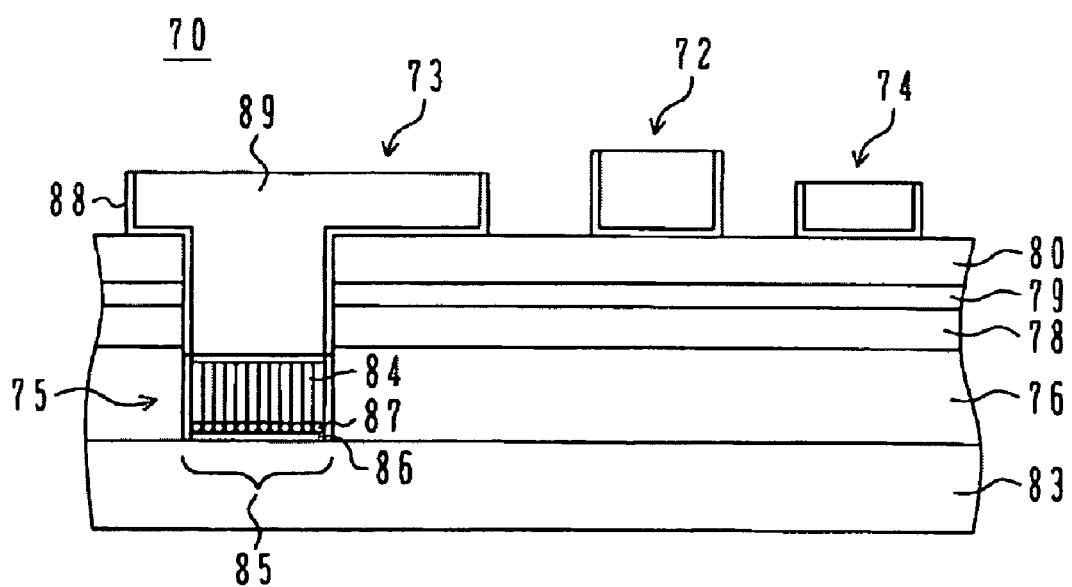

FIG. 7A is a plan view of a semiconductor device according to an embodiment of the present invention. FIG. 7B is a cross sectional view taken along A-A line shown in FIG. 7A. The semiconductor device 70 is constituted of two source electrodes 73, one drain electrode 74, two gate electrodes electrically connected together as a gate electrode 72 and formed between two source electrodes 73 and one drain electrode 74, and the like, respectively formed in one active region 71. Each electrode is made of, e.g., a lamination of a Ti layer 88 and an Au layer 89.

In the semiconductor device 70, an i-type GaN film 78 as a channel layer, an i-type AlGaN film 79 as a spacer layer and an n-type AlGaN film 80 as an electron supply layer are laminated in this order on an SiC substrate 76, and the source electrodes 73, gate electrode 72 and drain electrode 74 are disposed on the surface of the n-type AlGaN film 80. A current amount flowing between the source electrodes 73 and drain electrode 74 is controlled by controlling a flow of two-dimensional electron gas formed in the interface between the GaN film 78 and AlGaN film 79 by an electric field applied from the gate electrode 72.

A through electrode 75 is formed under the source electrode through the SiC substrate 76 to electrically and thermally interconnect the source electrode 73 and a ground electrode 83 of Au or the like formed on the surface 76b of the SiC substrate on the side opposite to the source electrode. The through electrode 75 is constituted of a carbon nanotube containing structure 85 including bundles of carbon nanotubes 84. The carbon nanotubes 84 are grown on Al—Fe catalytic fine particles 87 deposited on a Ta film 86 formed on the Au electrode 83.

Zr—Co or Hf—Co may be used instead of Al—Fe. An insulating substrate such as InP, GaAs and sapphire may be used instead of the SiC substrate. For manufacture processes of a semiconductor device, reference may be made to the disclosures in JP-A-2004-288833, JP-A-2005-22886 and JP-A-2005-285821, which are incorporated herein by reference.

Figure 8A:
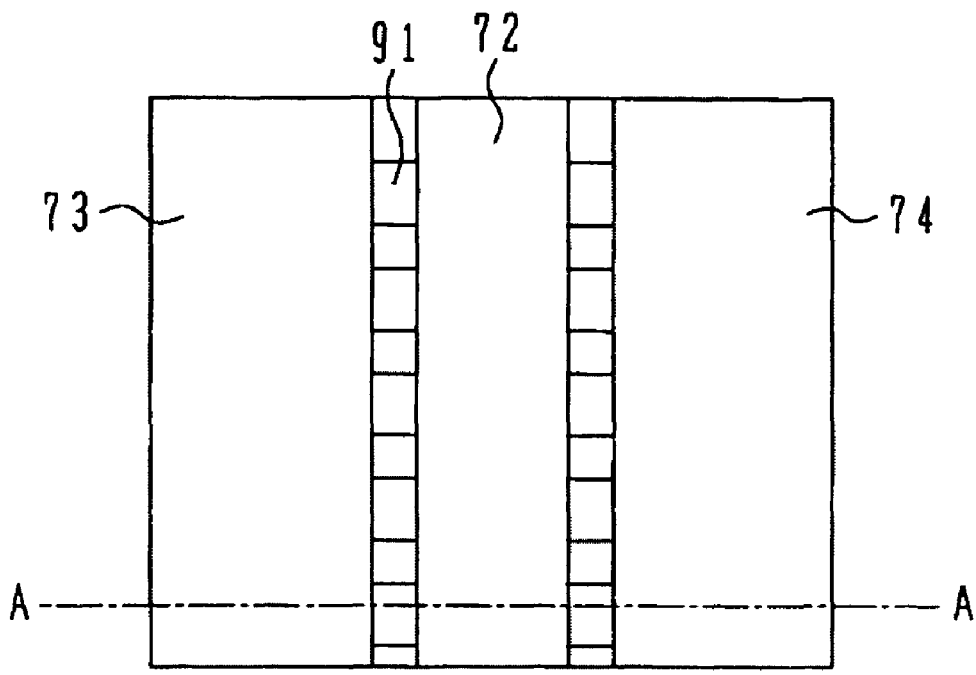
FIGS. 8A and 8B are a plan view of a field effect transistor of an embodiment and a cross sectional view taken along line A-A in FIG. 8A.
Figure 8B:
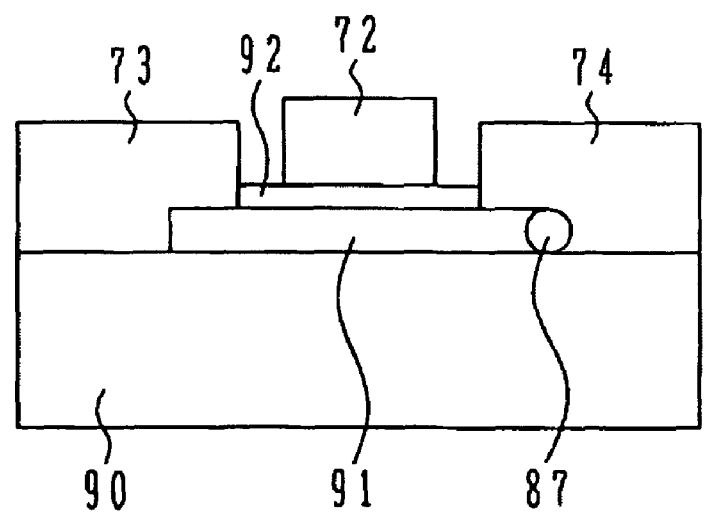

FIGS. 8A and 8B are a plan view and a cross sectional view (taken along one-dot chain line A-A shown in the plan view) of a field effect transistor utilizing a number of single-walled carbon nanotubes of the embodiment of the invention. Single-walled carbon nanotubes 91 as a transistor channel are grown in parallel between a sapphire substrate 90 and a drain electrode 74 and a source electrode 73. A gate insulating film 92 of $SiO_2$ or the like covers the surface between the drain electrode 74 and source electrode 73, and a gate electrode 72 is formed on the gate insulating film. In order to grown the carbon nanotubes as shown in FIGS. 8A and 8B, Al—Fe fine particles 87 having a diameter of 2.5 nm or shorter are deposited on the whole surface of the substrate 90, and thereafter the fine particles in an unnecessary area are removed by a chemical process such as lift-off. Since Al—Fe fine particles can grow nanotubes without limiting to a particular type of a substrate, any substrate can be selected as desired. After lift-off, the single-walled carbon nanotubes 91 are grown in parallel to the substrate by a method of applying an electric field between the electrodes or other methods, and thereafter electrode structures are formed. By using a number of single-walled nanotubes 91 as a channel, a large drain current can be obtained realizing a transistor operating at high speed and high frequency.

The present invention has been described in connection with the preferred embodiments. The invention is not limited only to the above embodiments. It will be apparent to those skilled in the art that other various modifications, improvements, combinations, and the like can be made.

What are claimed are:

1. A carbon nanotube containing structure comprising:
    a base body;
    catalytic fine particles deposited on said base body, each of the catalytic fine particles comprising alloy of Al—Fe, Zr—Co or Hf—Co; and
    carbon nanotubes grown on said catalytic fine particles.

2. The carbon nanotube containing structure according to claim 1, wherein said catalytic fine particles are made of Al—Fe binary metal having an Al atomic fraction of 0.1 at % to 99 at %.

3. The carbon nanotube containing structure according to claim 1, wherein said catalytic fine particles have a uniform diameter.

4. The carbon nanotube containing structure according to claim 3, wherein said catalytic fine particles are made of Al—Fe binary metal having an Al atomic fraction of 0.1 at % to 99 at %.

5. A method for manufacturing carbon nanotubes comprising:
    (a) depositing catalytic fine particles, each of the catalytic fine particles comprising alloy of Al—Fe, Zr—Co or Hf—Co on a base body; and
    (b) growing carbon nanotubes on said catalytic fine particles deposited on said base body.

6. The method for manufacturing carbon nanotubes according to claim 5, wherein said step (b) is performed by CVD using a source gas containing hydrogen carbide or alcohol.

7. The method for manufacturing carbon nanotubes according to claim 5, wherein said step (a) comprises:

(a-1) vaporizing a target containing Al—Fe, Zr—Co or Hf—Co in a carrier gas to form catalytic fine particles carried by said carrier gas; and (a-2) depositing said catalytic fine particles carried by said carrier gas on said base body.

8. The method for manufacturing carbon nanotubes according to claim 7, wherein said step (b) is performed by CVD using a source gas containing hydrogen carbide or alcohol.

9. The method for manufacturing carbon nanotubes according to claim 7, wherein said step (a-2) classifies said catalytic fine particles, and deposits classified ones of said catalytic fine particles on said base body, the classified ones of said catalytic fine particles having uniform diameter.

10. The method for manufacturing carbon nanotubes according to claim 9, wherein said step (b) is performed by CVD using a source gas containing hydrogen carbide or alcohol.

11. An electric function device comprising:
    a function element having electrical terminals; and
    a carbon nanotube containing structure connected to said electrical terminals, said carbon nanotube containing structure having catalytic fine particles containing Al—Fe, Zr—Co or Hf—Co and carbon nanotubes grown on said catalytic fine particles.

12. The electric function device according to claim 11, wherein said function element is a semiconductor device.

13. The electric function device according to claim 11, wherein said function element is a transistor comprising:
    a channel made of a plurality of carbon nanotubes disposed in parallel;
    source/drain electrodes connected to opposite ends of said plurality of carbon nanotubes;
    a gate insulating film formed covering said plurality of carbon nanotubes; and
    a gate electrode formed on said gate insulating film.

14. Catalytic fine particles for growing carbon nanotubes, each of the catalytic fine particles comprising alloy of Al—Fe, Zr—Co or Hf—Co.

15. The catalytic fine particles according to claim 14, wherein the catalytic fine particles have uniform diameter.

16. An electric function device comprising:
    a function element having electrical terminals; and
    a carbon nanotube containing structure connected to said electrical terminals, said carbon nanotube containing structure having catalytic fine particles, each of the catalytic fine particles comprising alloy of Al—Fe, Zr—Co or Hf—Co, and carbon nanotubes grown on said catalytic fine particles.

17. The electric function device according to claim 16, wherein said function element is a semiconductor device.

18. The electric function device according to claim 16, wherein said function element is a transistor comprising:
    a channel made of a plurality of carbon nanotubes disposed in parallel;
    source/drain electrodes connected to opposite ends of said plurality of carbon nanotubes;
    a gate insulating film formed covering said plurality of carbon nanotubes; and
    a gate electrode formed on said gate insulating film.

* * * * *